United States Patent [19]

Luettgen et al.

[11] Patent Number: 4,850,227
[45] Date of Patent: Jul. 25, 1989

[54] PRESSURE SENSOR AND METHOD OF FABRICATION THEREOF

[75] Inventors: Michael J. Luettgen, Madison, Wis.;
Dennis M. Koglin, Kokomo, Ind.;
Mark B. Kearney, Kokomo, Ind.;
John M. Hart, Jr., Kokomo, Ind.;
Ronald E. Brown, Kokomo, Ind.

[73] Assignee: Delco Electronics Corporation, Kokomo, Ind.

[21] Appl. No.: 136,579

[22] Filed: Dec. 22, 1987

[51] Int. Cl.$^4$ .......................... G01L 7/08; G01L 9/06; G01L 19/04
[52] U.S. Cl. .................................. 73/708; 29/621.1; 73/721; 73/756; 338/4
[58] Field of Search .................. 73/756, 720, 721, 726, 73/727, 728, 722, 718, 724, 4, 708; 338/4; 29/610 SG; 361/283; 310/321, 324, 323, 338

[56] References Cited

U.S. PATENT DOCUMENTS

| | | | |
|---|---|---|---|
| 3,858,150 | 12/1974 | Gurtler et al. | 338/2 |
| 4,033,787 | 7/1977 | Marshall | 148/1.5 |
| 4,295,117 | 10/1981 | Lake et al. | 338/4 |
| 4,372,803 | 2/1983 | Gigante | 156/626 |
| 4,456,901 | 6/1984 | Kurtz et al. | 338/4 |
| 4,492,825 | 1/1985 | Brzezinski et al. | 310/324 |
| 4,532,533 | 7/1985 | Jackson et al. | 357/16 |
| 4,618,397 | 10/1986 | Shimizu et al. | 156/628 |
| 4,708,012 | 11/1987 | Folk et al. | 73/4 R |

OTHER PUBLICATIONS

J. A. Oakes, "A Pressure Sensor for Automotive Application," *Proceedings of the Third International Conference on Automotive Electronics*, pp. 143-149, 20-23 Oct. 1981, London, England, sponsored by the Institute for Mechanical Engineers.

*Primary Examiner*—Donald O. Woodiel
*Attorney, Agent, or Firm*—Robert J. Wallace

[57] ABSTRACT

A pressure sensor includes a three part package including a housing member defining two spaced-apart chambers, a bottom member providing the bottom wall of one of the chambers, and a top cover member hermetically sealing the two chambers from one another and including a port for admission of gases into one of the chambers. A pressure sensing element is disposed in the chamber having the port and mounted on the bottom member, and a signal processing element is mounted in the other chamber. Electrical connections between the two elements are by means of leads which extend into each chamber and pass through a wall separating the chambers. A low temperature differential between the two elements is provided by extending one of the leads from the other one chamber to a position directly underlying and in intimate contact with the bottom surface of the processing element in the other chamber. Additionally, the bottom member is of a high thermal conductivity material and extends along the bottom of the housing member to beneath the other chamber.

18 Claims, 4 Drawing Sheets

PRESSURE SENSOR AND METHOD OF FABRICATION THEREOF

FIELD OF THE INVENTION

This invention relates to pressure sensors of the type using separate pressure sensing and electrical signal processing elements, and particularly to the packaging and fabrication of such sensors.

BACKGROUND OF THE INVENTION

Pressure sensors are used in automotive vehicles for a variety of purposes, for example, sensing the vacuum pressure at the intake manifold of a vehicle engine.

One known type of pressure sensor, described in an article by Oakes which appears in the proceedings of the Third International Conference on Automotive Electronic, 143-9, 1981, and is entitled "A Pressure Sensor for Automotive Application", *Mechanical Engineering Publications,* London, England, page 354, ISBN 085298 477 4, comprises a pressure sensing element, including a piezoresistive silicon semiconductor chip, and a separate semiconductor integrated circuit (IC) for receiving an electrical signal from the sensing element, processing the signal, and generating the output signal from the sensor. In this known sensor, the sensing element is completely enclosed in its own sub-package which includes outwardly extending terminals permitting electrical access to the enclosed sensing element. The sub-package is entirely enclosed, in turn, in the main package of the pressure sensor. The main package includes an inport which communicates directly with an opening in the sensing element sub-package permitting exposure of the sensing element to the pressure to be sensed.

The signal processing IC is also mounted within the package main housing and electrically connected to the terminals of the sensing element sub-package by wire bonds. Finally, wire bonds interconnect terminal portions of the signal processing IC to terminals of the main package.

It is desirable to improve such known sensor in four principal areas, namely: the differential operating temperature between the pressure sensing element and the signal processing element, size, simplicity of construction and fabrication, and cost.

SUMMARY OF THE INVENTION

In one illustrative embodiment, the present invention is directed to a pressure sensor comprising two chambers which are hermetically sealed one from the other with the first chamber containing a pressure sensing element and the second chamber containing a signal processing element. Electrical interconnections couple the two elements. A portion of the pressure sensor defines a port which couples the first chamber to a pressure to be sensed. The pressure sensor further comprises a relatively high thermal conductivity member having a portion thereof that thermally contacts a substantial portion of the signal processing element and having another portion thereof that extends into the second chamber such that any temperature differential between the two chambers is moderated.

In accordance with this invention, the aforementioned desired improvements are achieved as follows. The enclosure or package for the pressure sensor comprises two separate chambers which are hermetically sealed from one another. The pressure sensing element is disposed within one of the chambers and a port is coupled to that chamber to permit exposure of the sensing element to the pressure to be sensed. A signal processing element is disposed within the other chamber. Electrical interconnections between the two elements are by means of conductive leads which extend, in hermetic fit, through a wall separating the two chambers.

Temperature differentials between the two elements tend to introduce errors in the pressure sensing process. To moderate such temperature differentials, thermally and electrically conductive members (leads) are provided for closely thermally coupling together the two chambers and the respective elements therein. One such member comprises one of the interconnecting electrical leads which is disposed along the bottom surface of the chamber containing the signal processing element. A bottom surface of the signal processing element is mounted directly on an enlarged portion of the lead in good thermal relation therewith. The lead extends through the wall separating the chambers and directly into the chamber containing the sensing element. Heat from the sensing element chamber is thus conducted directly by the lead and into direct contact with the signal processing element. Other electrical leads which communicate between the two elements also serve to moderate temperature differentials between the two elements. Another such thermally conducting member comprises a separate base portion of the package which is formed from a material, e.g., a metal, which is more highly thermally conductive than other portions of the package. This base portion forms the bottom wall of the pressure sensing element chamber and extends beneath the wall separating the two chambers and directly beneath, and in intimate thermal connection with the wall forming the bottom of the other chamber. Heat from the pressure sensing chamber is thus transferred, via the bottom member, to the signal processing element chamber through the bottom wall thereof.

The pressure sensor is designed to allow the chamber containing the pressure sensor element to be pressurized to a test pressure while the other chamber is left open such that the signal processing element can be tested and modified as desired.

The invention may be better understood with aid of the detailed description taken in conjunction with the accompanying drawing.

DETAILED DESCRIPTION OF THE INVENTION

Figure 1:
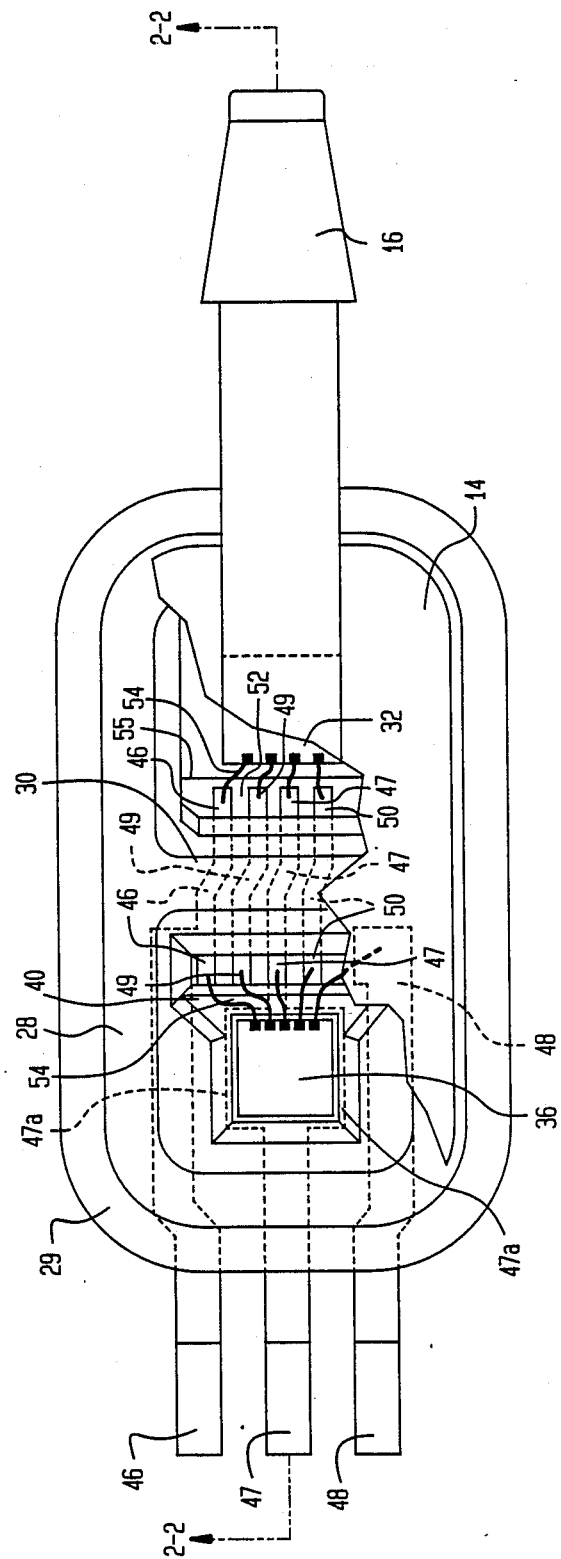
FIG. 1 is a plan view, partly broken away, of a pressure sensor in accordance with this invention.
Figure 2:
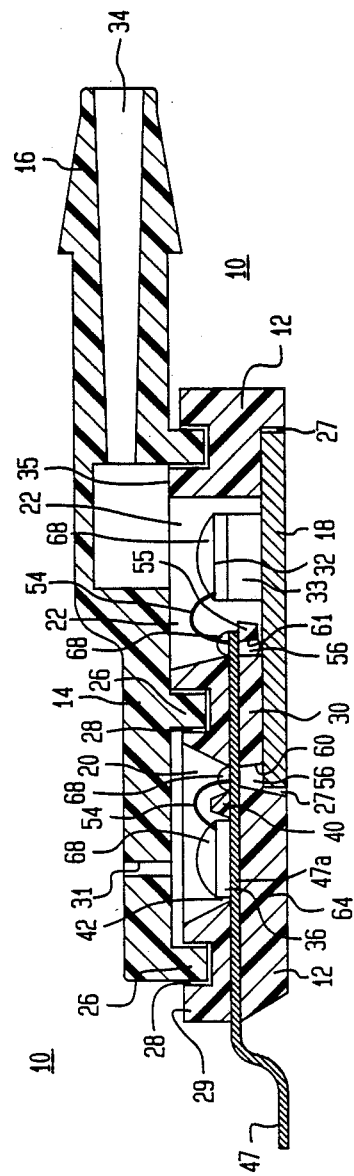
FIG. 2 is a sectional view of the sensor shown in FIG. 1 taken along line 2—2 thereof.

With reference to FIGS. 1 and 2, there is shown a pressure sensor 10 (also denoted as a pressure sensor assembly 10) in accordance with this invention. FIG. 2 shows a cross sectional view of FIG. 1 along dashed line 2—2. The sensor 10 comprises a three-part package which includes a main housing member 12, a top cover member 14, which includes a port member 16 and an air vent hole 31, and a bottom closure member 18. The housing member 12 and the cover member 14 are preferably made of a known thermoplastic resin, and the bottom member 18 is preferably formed of a high thermally conductive material, e.g., a metal such as aluminum, or a high thermally conductive ceramic. To provide an hermetic fit between the top member 14 and the housing member 12, a tongue-in-groove joint is used, the tongue portion 26 of the joint (FIG. 2) being dependent from the cover member 14, and the groove portion 28 being provided in the housing member 12. A recess 27 is provided in the bottom surface of the housing member for receipt of the bottom member 18.

The pressure sensor 10 contains two spaced-apart chambers 20 and 22. The package walls defining the chambers include an outer wall 29 of the housing member 12 and an inner wall 30 bisecting the housing member and hermetically separating the two chambers 20 and 22.

Figure 3:
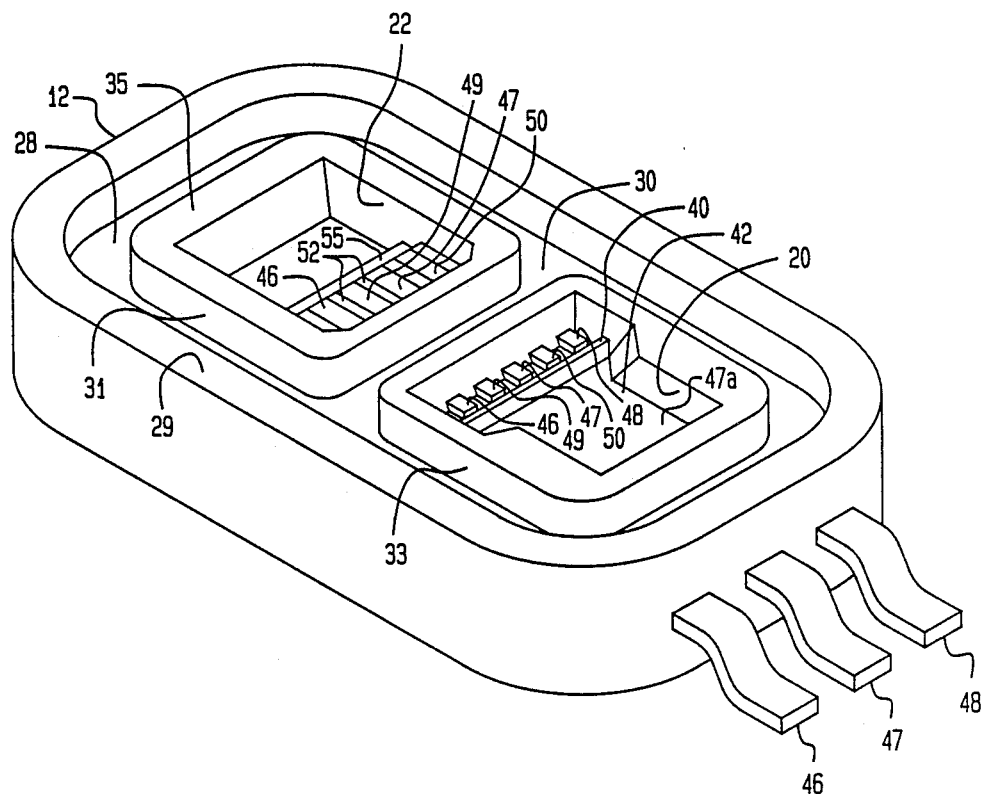
FIG. 3 is a view, in perspective, of one portion of a three-part package or enclosure for the sensor shown in FIGS. 1 and 2.
Figure 4:
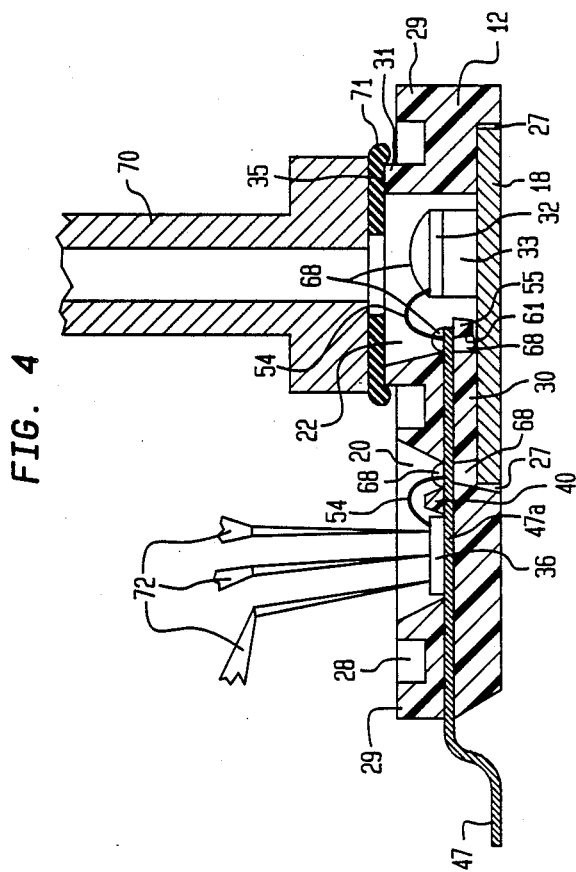
FIG. 4 is a view, in side section, showing a step in the fabrication of the pressure sensor.

As best seen in FIG. 3, which is a view in perspective of the housing member 12 of pressure sensor assembly 10 by itself, the groove 28, which forms part of the tongue-in-groove joint with the top cover member 18 (FIG. 2), is formed in the top surfaces of the two walls 29 and 30. The inside wall of the groove 28 defines two wall or lip portions 31 and 33, the lip portion 31 forming part of the wall defining the chamber 22 and the lip portion 33 forming part of the wall defining the chamber 20. As best seen in FIG. 4, which is a view of the sensor 10 without its top cover member 14, the lip portion 31 around the chamber 22 forms a cylinder which projects beyond the upper surface of other portions of the two walls 29 and 30. The upper end of the lip portion (or cylinder) 31 terminates in an annular surface 35 (FIG. 3). The purpose of these structural details is described hereinafter.

Returning to FIGS. 1 and 2, disposed within the chamber 22 is a pressure sensing element 32 of known type, e.g., a silicon semiconductor chip of the type described in the aforementioned Oakes article. The chamber 22 communicates with the opening 34 through the port member 16 for the admission of the pressure to be sensed by element 32 disposed within the chamber 22.

Disposed within the other chamber 20 is a semiconductor integrated circuit (IC) chip 36 of known type referred to as a signal conditioning or processing element. As known, the purpose of the processing element 36 is to receive an electrical signal from an electrical circuit (e.g., a Wheatstone bridge circuit—not shown) on the pressure sensing element 32 and process it (e.g., provide temperature compensation and signal amplification) to produce an output signal from the sensor.

Included within the chamber 20 is a low wall 40 having sloped sides which extends parallel to the wall 30 separating the two chambers 20 and 22. This low wall 40, along with the housing member outer wall 29 (which also has sloped sides within the chamber 20), defines a recess 42 (typically rectangular—see, also, FIG. 3) within the chamber 20 for receipt of the signal processing element 36.

The sensing and signal processing elements 32 and 36 are interconnected to one another and to terminal leads of the sensor as follows. Partially embedded within the material of the housing member 12 are a number of conductive leads 46 through 50. With reference to FIG. 1, various portions of each of the leads are exposed within each of the two chambers 20 and 22. Also, three of the leads 46, 47, and 48 extend outwardly from one end of the housing member 12 and serve as exterior terminals for the sensor 10. Other leads, not shown, can be provided extending from the other end of the housing to serve as means for mechanically supporting the sensor, e.g., within a socket of known type, not shown.

The paths of the various leads are shown, partially in dashed lines where the leads are embedded within the housing member 12, in FIG. 1. Thus, starting with the two outer terminal leads 46 and 48, these leads extend into the housing member 12 and pass, still embedded within the housing member material, on either side of the chamber 20. The two leads 46 and 48 then emerge (FIG. 1) within the chamber 20 in the space between the low wall 40 within the chamber 20 and the wall 30 separating the two chambers 20 and 22. The lead 46 continues through the wall 30 and emerges, exposed, within the chamber 22. The other lead 48 also continues into the wall 30 but terminates there.

The third, central terminal lead 47 extends into the housing member 12 and directly into the chamber 20 (see also FIG. 3). Within the chamber, the width of the lead 47 expands in a portion 47a thereof to completely cover the bottom surface of the recess 42. (The edges of the expanded lead portion 47a thereof to completely cover the bottom surface of the recess 42. (The edges of the expanded lead portion 47a extend beneath the recess walls, hence the edges are shown in dashed lines in FIG. 1.) Beyond the recess 42, the lead 47 narrows in width, passes (FIG. 2) under the low wall 40, and becomes exposed again in the space between the recess wall 40 and wall 30 and emerges within the chamber 22. As shown in FIG. 1, the various leads which pass through the wall 30 follow a zigzag path for better utilization of the package space.

Two more leads 49 and 50 (see FIGS. 1 and 3) are provided. These leads start, exposed, on the bottom surface of the chamber 20 in the space between the two walls 40 and 30, pass through the wall 30, and emerge within the chamber 22.

Electrical interconnections between the two elements 32 and 36 and the various leads, and thus to each other and the sensor terminals 46, 47, and 48, are by means of wire bonds 54 (FIG. 2).

As noted, each of the leads 46, 47, 49, and 50 extends into the chamber 22. As shown in FIG. 3, and by the type of cross-hatching used in FIG. 2, the spaces between the leads are filled with thin layers or webs 52 of the material of the housing member 12. Also, suspended both from the webs 52 and the leads at a position adjacent to the forward ends of the leads within the chamber 22 is a bar 55 of the material of the housing. The combination of the continuous surface formed by the alternating leads and webs, and the dependent bar 55 forms a trough 61 (FIG. 2) which is preferably filled with a known protective or passivating substance 56 for hermetically sealing the exposed joints between the wall 30 and the emerging leads. This is known as "backside passivation" of the leads. A silicon adhesive can be used as a passivating substance.

Similarly, to provide backside passivation of the various leads where they first enter the wall 30 from the chamber 20, a trench 60 is provided through the bottom wall 64 of the chamber 20. To avoid excessive complication of the drawings, the trench (trough) 60 is not shown in FIG. 1. However, the trench 60 extends beneath the space between the two walls 40 and 30 a distance sufficient to fully expose the undersides of all the leads where they extend into (and thus form joints with) the chamber separating wall 30. This trench 60 is also filled with the passivating substance 56.

As previously noted, a function of the signal processing element 36 (within the chamber 20) is to process the electrical signal from the pressure sensing element 32. It is a known characteristic of such processing elements that the output signal therefrom is a function (among other things) of the temperature differential between the processing and pressure sensing elements. However, the temperature of the gases admitted into the pressure sensing chamber 20 during use of the sensor 10 is variable. This can give rise to a variable temperature differential between the sensing and processing elements which, in turn, can cause errors in the output signal of the sensor.

In accordance with this invention, means are provided for reducing any temperature differential between the signal processing and pressure sensing elements 32 and 36.

In a preferred embodiment of the invention, a first means for reducing temperature differentials between elements 32 and 36 comprises electrical lead 47 which enters chamber 20 and runs under signal processing element 36 and makes good thermal contact therewith. The portion of lead 47, shown as portion 47a, which is under a bottom surface of element 36, is enlarged and typically has an area greater than the foot print of element 36. Lead 47 passes through wall 30 and enters chamber 22. Another bonding lead 54 is bonded by one end to lead 47 where it enters chamber 22 and is bonded by a second end to a bonding pad on a top surface of element 32. The physical shape of lead 47 and its location facilitates a good transfer of heat to element 36 from chamber 22 and element 32. This helps moderate any temperature differentials between elements 32 and 36. In this embodiment lead 47 is essentially electrically isolated from the bottom of element 36 and a bonding lead 54 makes electrical contact between a bonding pad on a top surface of element 36 and a portion of lead 47. In some applications it is feasible that portion 47a of lead 47 could make both thermal and electrical contract to the bottom surface of element 36.

A second means for reducing temperature differentials between elements 32 and 36 comprises the various leads 46, 49, and 50 which extend between and into both chambers.

A third means for reducing temperature differentials between elements 32 and 36 comprises the bottom closure member 18 (FIG. 2) which, as previously mentioned, is preferably made of a high thermal conductive material and which extends from beneath the chamber 22 to beneath the chamber 20. In use of the pressure sensor 10, hot gases admitted into the chamber 22 heat the bottom member 18 which conducts, with little temperature drop, heat energy from the chamber 22 to the bottom wall 64 of the chamber 20. As shown, the portion of the chamber bottom wall 64, which directly overlies the bottom member 18, is of reduced thickness (by the thickness of the bottom member 18), and heat from the bottom member 18 is conducted through the bottom wall 64 to the enlarged portion 47a of the lead 47. This lead portion 47a, which, as previously described, underlies the entire bottom surface of the signal processing element 36 (see FIG. 1), provides an excellent path for heat conduction to the element 36.

It is estimated that with a temperature range of from −40 degrees C. to +125 degrees C. for the gases admitted into the chamber 22, the temperature differential between the sensing and processing elements 32 and 36 should be approximately 5 degrees C. A temperature differential of up to approximately 15 degrees C. is useful. This is small enough so as not to introduce unacceptably high errors in the output reading from the pressure sensor.

In a typical embodiment of pressure sensor 10, the housing member 12 and the top cover member 14 are formed from a thermoplastic resin and are fabricated using known molding techniques. In the case of the housing member 12, the various leads are first formed as part of a stamped or etched sheet of metal held together by a peripheral frame. This sheet, known as a lead frame, is placed within a mold, and the thermoplastic resin is forced into the mold to form the housing member 12 around the various leads. Upon opening of the mold and removal of the workpiece, the frame peripheral members, which are not embedded within the material of the housing member, are broken away to electrically isolate the various leads from one another. The remaining package part, i.e., the bottom cover member 18, is preferably formed by a stamping process.

A preferred embodiment of pressure sensor 10 is assembled as follows: A sensing element 32 of the type shown in the aforementioned Oakes article is used. Briefly, the element 32 comprises a disc of semiconducting material, e.g., silicon, having a recess therein forming a pressure sensitive diaphragm. A simple Wheatstone bridge circuit is formed within the silicon disc by appropriate doping techniques, and terminal pads are provided on the disc by means of which electrical interconnections can be made thereto. The disc is electrostatically bonded to a block of borosilicate glass 33, for purposes of stress isolation, and the glass block, in turn, is mounted and glued to a top surface of the bottom cover member 18. Passivating substance 56 is then put into troughs 60 and 61 and then bottom member 18 is adhesively attached (i.e., glued) to main housing member 16 to close the bottom of chamber 22 and to form a hermetic seal. Additional amounts of passivating substance 56 are placed in recess 27. For the sake of simplicity the drawings do not show substance 56 in recess 27.

The signal processing element 36 is then glued in place within the recess 42 formed within the chamber 20. Proper positioning of the element 36 within the recess 42 is simplified by the sloped sides of the recess defining walls 29 and 40. Also, a known high thermal conductive adhesive is preferably used to provide an intimate and good thermal conducting interface between the bottom surface of the element 36 and the enlarged lead portion 47a at the bottom of the recess.

The wire bond connections 54 are then made between various terminal pads on each of the signal processing and pressure sensing elements and the exposed surface portions of the leads in each of the respective chambers 20 and 22. A known protective coating 68 (FIG. 2) is then applied over the pressure sensing element 32 to protect it against any hostile environment, e.g., automotive engine gases, which it will encounter is use. The coating 68 is also applied over the exposed surface portions of the leads including the ends of the wires 54 boned thereto to protect against any hostile environment and to help hermetically seal chamber 22 where the electrical leads enter same from chamber 20. In an illustrative embodiment coating 68 is a long chain polymer.

At this point in the assembly of the pressure sensor 10, the electrical parameters of the processing element 36 are evaluated and adjusted as necessary. To this end, a test pressure applying means, known as a boot 70 (FIG. 4), is applied against the top surface 35 of the upwardly extending lip portion or cylinder 31 surrounding the chamber 22, and a test pressure or vacuum is applied to the chamber 22 via the boot. To provide an hermetic seal between the boot 70 and the cylinder 31, a rubber gasket 71 is provided at the end of the boot. Because the cylinder 31 extends higher than other wall portions of the housing member 12, as previously described, the rubber gasket 71, when squeezed between the boot and cylinder end surface 35, is free to deform downwardly and around the cylinder wall. This, it is found, ensures an hermetic fit between the boot 70 and the chamber 22.

With the boot 70 in place and a pressure applied to the chamber 22, the package is tested, using known procedures, for leaks between the two chambers 20 and 22. If there are no leaks, the next step, with the boot 70 in place and a known pressure applied to the pressure sensing element 32, is to measure the electrical parameters of the signal processing element 36. Then, as necessary, adjustments (i.e., the trimming of resistors) are made to the element 36 to adjust its parameters to provide a preselected output signal consistent with the test pressure.

A feature of the package of this invention is that the provision of the two separate chambers 20 and 22 allows the enclosure of the chamber 22 by the boot 70 while leaving the chamber 20 and the element 36 therein fully uncovered. This allows unencumbered access to and direct contacting of the element 36 by means of electrical probes 72, or the like, for measuring the electrical parameters of the element 36. Then, using known techniques, these parameters are adjusted as necessary. For example, different ones of the probes can be used to send currents through selected current paths for burning open these paths, thereby selectively altering the electrical characteristics of the element circuits. Alternatively, and particularly because of the direct access to the element 36 surface, a laser beam can be used to burn open selective portions of the circuitry to make the desired adjustments.

After completion of the testing and adjusting procedures, the boot 70 is removed and a protective coating 68 (FIG. 2) is applied over the processing element 36 and over the portions of the electrical leads and bonding wires where the electrical leads enter wall 30. The pressure sensor 10 is completed by the addition of the top cover member 14. The top cover member 14 is hermetically sealed to the housing member 12 by means of an adhesive which is dispensed into the groove 28 surrounding the chambers 20 and 22. Vent hole 31 in top cover member 14 serves to allow any air in the adhesive used in the portion of groove 28 surrounding chamber 20, which might escape into chamber 20, to be vented out. Thus helps eliminate any build up of pressure in chamber 20 which could cause a break in the hermetic seal between chambers 20 and 22.

It is to be appreciated that various modifications may be made to the pressure sensor without departing from the spirit of the invention. For example, the high conductivity member 18 could extend further across the bottom of chamber 29 to further increase the thermal equalization desired between the processing and sensing elements. Still further, the outside geometry of pressure sensor 10 can readily be modified to permit use of pressure sensor 10 in different mounting arrangements. Furthermore, top cover member 14 can be replaced with two separate portions. The first portion would cover chamber 20 and the second portion would cover chamber 22. Still further, in some applications bottom member 18 can be of the same material as main housing member 12.

The embodiments of the invention in which an exclusive property or privilege is claimed are defined as follows:

1. A process for fabricating a pressure sensor comprising the steps of:
   disposing a pressure sensing element within a first chamber within a portion of a package of said sensor;
   disposing a signal processing element within a second chamber within said package portion;
   electrically interconnecting said two elements;
   leaving said second chamber and the signal processing element therein hermetically unenclosed while hermetically enclosing said first chamber and exposing said sensing element to apparatus which generates a known test pressure;
   adjusting electrical parameters of the signal processing element in accordance with said known test pressure being applied to the pressure sensing element;
   removing said known pressure; and
   sealing an enclosing member to said package portion for hermetically sealing at least said first chamber from the ambient while providing a port which provides access to said first chamber.

2. A process for fabricating a pressure sensor comprising the steps of:
   disposing a pressure sensing element within a first chamber within a portion of a package of said sensor;
   disposing a signal processing element within a second chamber within said package portion;
   electrically interconnecting said two elements;
   leaving said second chamber and the signal processing element therein exposed to ambient pressure and exposed for adjustment while hermetically enclosing said first chamber and exposing said sensing element to a known test pressure;
   measuring electrical parameters of the signal processing element while applying the known test pressure to the pressure sensing element;
   laser trimming selected portions of the circuitry on the signal processing element consistent with the known test pressure to provide desired adjustments;
   removing the test pressure from the sensing element; and
   sealing an enclosing member to said package portion for hermetically sealing at least said first chamber from the ambient while providing a port which provides access to said first chamber.

3. A pressure sensor comprising:
   a package comprising a housing member having integral therewith an outside wall and an interior wall which define two chambers separated from each other by the interior wall;
   a pressure sensing element disposed in a first of said chambers, and a signal processing element disposed in a second of said chambers;

a plurality of conductive leads extending through said interior wall and being exposed within each of said chambers;

at least one of said leads having an enlarged portion that is in thermal contact with a substantial portion of the signal processing element;

bonding wires electrically interconnecting said two elements to said conductive leads;

a second wall in said housing member, spaced from said interior wall and extending up into said second chamber, and other walls in said second chamber defining a recess within said second chamber for receiving said signal processing element;

inwardly sloped side walls on said recess that provide guide means for proper positioning of said signal processing element in said second chamber;

a cover member on said housing member hermetically sealing said first chamber;

a port in the cover member coupled to said first chamber for connection of said first chamber to a pressure to be sensed.

4. The pressure sensor of claim 3 in which said conductive leads are exposed at the bottom of said second chamber in the space between said interior and second walls, and said bonding wires bridge said second wall for interconnecting said signal processing element to said conductive leads.

5. The pressure sensor of claim 4 in which an exposed portion of one of said conductive leads extends under said second wall into, and completely covering the bottom surface of said recess, said signal processing element being bonded, in intimate thermal contact with said surface covering lead portion.

6. The pressure sensor of claim 3 further comprising:
a bottom surface portion of said second chamber being formed from a high thermal conductivity material;
said signal processing element being mounted on said surface portion in intimate thermal contact therewith; and
an extension of said surface portion passes through said interior wall and into said first chamber and provides a high thermal conductivity path for transfer of heat from said first chamber to said signal processing element.

7. The pressure sensor of claim 3 comprising an encapsulating material disposed on said conductive leads in areas of entry into and exit from said interior wall for hermetically sealing exposed joints between said conductive leads and said interior wall.

8. A process for fabricating a pressure sensor comprising the steps of:
disposing a pressure sensing element within a first chamber within a portion of a package of said sensor;
disposing a signal processing element within a second chamber within said package portion;
electrically interconnecting said two elements;
leaving said second chamber and the signal processing element therein unenclosed while hermetically enclosing said first chamber and exposing said sensing element to apparatus which generates a preselected test pressure;
contacting the signal processing element for adjusting the electrical parameters thereof in accordance with the test pressure;
removing the test pressure; and
sealing an enclosing member to said package portion for hermetically sealing said two chambers from one another while providing a port which provides access to said first chamber.

9. The process of claim 8 in which said hermetic enclosing step is performed using a cylindrical boot having an annular sealing gasket on the end thereof, and engaging said gasket with an annular surface formed at the top of an upwardly projecting cylinder defining the top, open surface of said first chamber, the outside edge of said gasket extending beyond the outside edge of said annular surface and being slightly deformed by the engaging pressure, around the top wall of said cylinder for providing a tight, hermetic fit between said gasket and said cylinder.

10. A process for forming a pressure sensor assembly having first and second chambers with electrical leads communicating between chambers comprising the steps of:
sealing bottom and side portions of the electrical leads so as to hermetically isolate the chambers from each other where the leads pass from one chamber to the other;
attaching a back cover to a body portion of the pressure sensor assembly and forming a hermetic seal at the intersection of the back cover and the body portion;
disposing a pressure sensor element within the first chamber and disposing a signal processing element in the second chamber;
electrically coupling each of the elements to the electrical leads;
coating a portion of the pressure sensor element and coating top and side portions of the portions of the electrical leads in the first chamber with a passivating material;
hermetically enclosing the first chamber and exposing the sensing element to a preselected test pressure while leaving the second chamber and the processing element therein unenclosed;
sensing signals from the processing element and adjusting portions of the processing element such that signals received therefrom correspond to the applied test pressure;
removing the test pressure from the first chamber;
coating a portion of the processing element and top and side portions of the portions of the electrical leads in the second chamber; and
attaching a top cover to the body of the sensor for hermetically sealing the first chamber and thus hermetically isolating the first chamber from the second chamber, said top cover defining a port which provides access to the first chamber.

11. A pressure sensor comprising:
a package comprising a housing member having integral therewith an outside wall and an interior wall which define two chambers separated from each other by the interior wall;
a pressure sensing element disposed in a first of said chambers, and a signal processing element disposed in a second of said chambers;
a plurality of conductive leads extending through said interior wall and being exposed within each of said chambers;
at least one of said conductive leads having an enlarged portion that is in thermal contact with a substantial portion of the signal processing element;

means for electrically interconnecting said two elements to said leads;

a second wall in said housing, spaced from said interior wall and extending up from the bottom of said second chamber, for defining a recess within said second chamber for receipt of said signal processing element;

inwardly sloped side walls on said recess that provide guide means for proper positioning of said signal processing element therein;

a cover member on the housing hermetically sealing said first chamber; and a port on the cover member for coupling the first chamber to a pressure to be sensed.

12. The pressure sensor of claim 11 wherein said housing member does not form a bottom wall for either of said first and second chambers adjacent said interior wall, effective to expose bottom surfaces as well as top surfaces of said conductive leads on opposite sides of said interior wall, and spaces between said conductive leads are filled with housing member material where said leads enter said interior wall.

13. The pressure sensor of claim 12 wherein said bottom and top exposed surfaces in at least one of the chambers are covered with a hermetic sealant where said conductive leads enter said interior wall.

14. A pressure sensor comprising:

a package comprising a housing member having integral therewith an outside wall and an interior wall which define two chambers separated from each other by the interior wall;

a pressure sensing element disposed in a first of said chambers, an integral bottom wall partially across a second of said chambers;

a signal processing element supported by said bottom wall of said second chamber;

a plurality of electrically conductive leads extending through said interior wall and being exposed within each of said chambers;

bonding wires electrically interconnecting said two elements with said conductive leads;

at least one of said leads having an enlarged portion that provides thermally conductive bottom wall portion for said second chamber;

said signal processing element supported on said thermally conductive bottom wall portion in intimate thermal contact therewith;

a closure member of a material having a higher thermal conductivity than that of material forming said housing, said closure member forming a bottom wall of said first chamber and extending beneath said interior wall to a position underlying said second chamber, effective to form a high thermal conductivity path for heat transfer from said first chamber to said processing element;

a cover member on the housing hermetically sealing said first chamber;

a port in said cover coupled to said first chamber for connection of said first chamber to a pressure to be sensed.

15. A pressure sensor comprising:

a package comprising a housing member having integral therewith an outside wall and an interior wall which define two chambers separated from each other by the interior wall;

a pressure sensing element disposed in a first of said chambers and a signal processing element disposed in a second of said chambers;

a plurality of electrical conductive leads extending through said interior wall and being exposed within each of said chambers;

at least one of said leads having an enlarged portion that provides a thermally conductive bottom wall portion for said second chamber;

said signal processing element supported on said thermally conductive bottom wall portion in thermal contact therewith;

means for electrically interconnecting said two elements to said conductive leads;

a lip completely around said first chamber upper end that forms a cylinder which projects beyond the upper surface of adjacent portions of the housing member, effective to form an annular surface around said first chamber that can be selectively hermetically sealed;

a cover member on the housing hermetically sealing said first chamber;

a port in said cover coupled to said first chamber for connection of said first chamber to a pressure to be sensed.

16. The pressure sensor of claim 15 wherein said first chamber has a closure member of a material having a higher thermal conductivity than that of material forming said housing, said closure member forming a bottom wall of said first chamber and extending beneath said interior wall to a position underlying said second chamber, effective to form a high thermal conductivity path for heat transfer from said first chamber to said processing element.

17. The pressure sensor of claim 15 wherein said second chamber has a recess, said enlarged portion of said conductive lead completely covers the bottom surface of the recess, and the signal processing element is nested in said recess and disposed on said bottom portion in intimate thermal contact therewith.

18. The pressure sensor of claim 16 wherein said second chamber has a recess, said enlarged portion of said conductive lead completely covers the bottom surface of the recess, and the signal processing element is nested in said recess in intimate thermal contact with said bottom portion.

* * * * *